(12) United States Patent
Wu et al.

(10) Patent No.: US 10,916,505 B2
(45) Date of Patent: Feb. 9, 2021

(54) GRAPHENE DIFFUSION BARRIER

(71) Applicant: Applied Materials, Inc., Santa Clara, CA (US)

(72) Inventors: Yong Wu, Sunnyvale, CA (US); Srinivas Gandikota, Santa Clara, CA (US); Abhijit Basu Mallick, Palo Alto, CA (US); Srinivas D. Nemani, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/536,603

(22) Filed: Aug. 9, 2019

(65) Prior Publication Data
US 2020/0051920 A1 Feb. 13, 2020

Related U.S. Application Data

(60) Provisional application No. 62/717,824, filed on Aug. 11, 2018.

(51) Int. Cl.
H01L 23/532 (2006.01)
H01L 21/285 (2006.01)
H01L 21/768 (2006.01)
C23C 16/455 (2006.01)
C23C 16/26 (2006.01)
H01L 21/3205 (2006.01)
H01L 27/115 (2017.01)

(52) U.S. Cl.
CPC ........ H01L 23/53266 (2013.01); C23C 16/26 (2013.01); C23C 16/45536 (2013.01); H01L 21/28568 (2013.01); H01L 21/32051 (2013.01); H01L 21/76841 (2013.01); H01L 27/115 (2013.01)

(58) Field of Classification Search
CPC ......... H01L 23/53266; H01L 21/28568; H01L 21/76841; H01L 21/32051; H01L 27/115; H01L 23/53238; H01L 23/53252; H01L 21/28562; C23C 16/45536; C23C 16/26
See application file for complete search history.

(56) References Cited

U.S. PATENT DOCUMENTS

| 9,076,795 | B1 | 7/2015 | Saito et al. |
| 9,741,663 | B2 | 8/2017 | Ishikura et al. |
| 2011/0006425 | A1 | 1/2011 | Wada et al. |
| 2012/0161098 | A1 | 6/2012 | Hiura et al. |
| 2013/0113102 | A1* | 5/2013 | Bao ............... H01L 21/76873 257/751 |

(Continued)

OTHER PUBLICATIONS

PCT International Search Report and Written Opinion in PCT/US2019/045872 dated Nov. 22, 2019. 10 pages.
(Continued)

*Primary Examiner* — Victor A Mandala
(74) *Attorney, Agent, or Firm* — Servilla Whitney LLC

(57) ABSTRACT

A graphene barrier layer is disclosed. Some embodiments relate to a graphene barrier layer capable of preventing diffusion from a fill layer into a substrate surface and/or vice versa. Some embodiments relate to a graphene barrier layer that prevents diffusion of fluorine from a tungsten layer into the underlying substrate. Additional embodiments relate to electronic devices which contain a graphene barrier layer.

18 Claims, 2 Drawing Sheets

(56) References Cited

U.S. PATENT DOCUMENTS

| | | |
|---|---|---|
| 2013/0299988 A1 | 11/2013 | Bonilla et al. |
| 2014/0084250 A1 | 3/2014 | Wada et al. |
| 2014/0151826 A1 | 6/2014 | Kelber et al. |
| 2014/0272350 A1* | 9/2014 | Kim .................. G02F 1/1339 428/213 |
| 2014/0339700 A1 | 11/2014 | Ren et al. |
| 2015/0262940 A1 | 9/2015 | Kitamura et al. |
| 2016/0240482 A1* | 8/2016 | Song ................ H01L 21/76843 |
| 2016/0300792 A1 | 10/2016 | Kim et al. |
| 2018/0122856 A1* | 5/2018 | Banerjee ................ H01L 45/04 |
| 2018/0166333 A1* | 6/2018 | Yang ................ H01L 23/53295 |
| 2018/0350913 A1* | 12/2018 | Yang ................ H01L 23/53223 |
| 2019/0123273 A1* | 4/2019 | Lee ................ H01L 45/146 |

OTHER PUBLICATIONS

Tsetseris, L., et al., "Graphene: An impermeable or selectively permeable membrane for atomic species?", ScienceDirect, Oct. 1, 2013, 58-63.

\* cited by examiner

… (1)

GRAPHENE DIFFUSION BARRIER

CROSS-REFERENCE TO RELATED APPLICATIONS

This application claims priority to U.S. Provisional Application No. 62/717,824, filed Aug. 11, 2018, the entire disclosure of which is hereby incorporated by reference herein.

TECHNICAL FIELD

Embodiments of the present disclosure generally relate to the use of graphene diffusion barriers to prevent diffusion of elements across a boundary. Additional embodiments of the present disclosure relate to electronic devices which comprise graphene diffusion barriers.

BACKGROUND

Preventing the movement of elements from one material in an electronic device into another material has been a long recognized problem in the semiconductor art. Diffusion barriers have been developed to prevent the diffusion of large atoms, like metals.

As the semiconductor field advances, many fabrication techniques utilize processes that rely on materials comprising smaller elements, like boron and fluorine. These atoms can readily diffuse from one material to another potentially damaging or adversely altering the properties of the material into which they diffuse.

Accordingly, there is a need for new diffusion barriers which prevent the diffusion of smaller atoms.

SUMMARY

One or more embodiments of the disclosure are directed to a method of forming an electronic device. The method comprises forming a graphene barrier layer on a substrate surface. A fill layer is deposited over the graphene barrier layer. The graphene barrier layer prevents diffusion of at least one element between the fill layer and the substrate surface.

Additional embodiments of the disclosure are directed to a method of forming an electronic device. The method comprises forming a graphene barrier layer on a substrate surface comprising $Al_2O_3$. The graphene barrier layer has a thickness in a range of about 15 Å to about 100 Å. An amorphous silicon layer is formed on the graphene barrier layer. The amorphous silicon layer is exposed to a tungsten precursor to form a tungsten layer by atomic substitution. The tungsten precursor comprises $WF_6$. The graphene barrier layer prevents diffusion of fluorine into the substrate surface.

Further embodiments of the disclosure are directed to an electronic device comprising a graphene barrier layer between a first material and a second material. The graphene barrier layer prevents diffusion of at least one element between the first material and the second material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
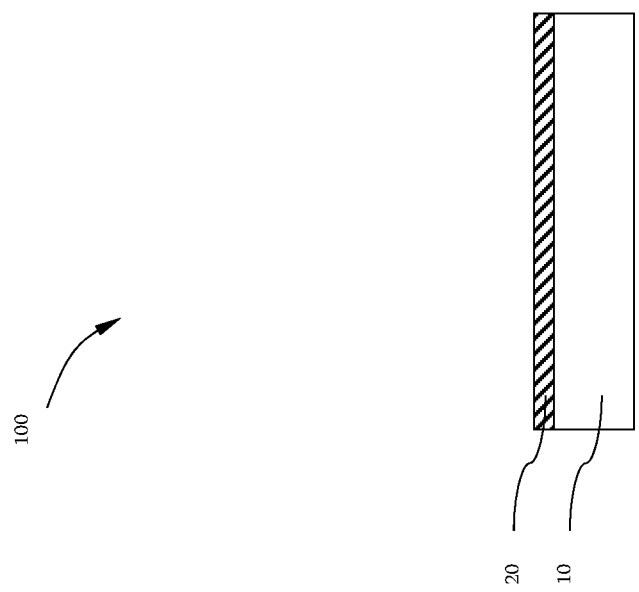
FIG. 1 illustrates a cross-sectional view of a substrate during processing according to one or more embodiments described herein.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate surface" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Some embodiments of the present disclosure relate to the use of graphene as a barrier layer. Additional embodiments of the present disclosure relate to methods of forming an electronic device comprising a graphene barrier layer. Further embodiments of the present disclosure relate to electronic devices which comprise a graphene barrier layer. Some embodiments of this disclosure advantageously provide a barrier layer capable of blocking the diffusion of small atoms, like boron and fluorine. Some embodiments of this disclosure advantageously provide for thinner barrier layers with equal or superior blocking capabilities. Some embodiments of this disclosure advantageously provide for thinner barrier layers which allow for a greater quantity of fill material with lower resistivity.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface are exposed simultaneously to the two or more reactive compounds so that no given point on the substrate is exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second reactive gas (i.e., a second precursor or compound B) is pulsed into the reaction zone followed by a second delay. During each time delay, a purge gas, such as argon or helium, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive gases are alternatively pulsed until a desired film or film thickness is formed on the substrate surface. In either scenario, the ALD process of pulsing compound A, purge gas, compound B and purge gas is referred to as a cycle. A cycle can start with either compound A or compound B and continue the respective order of the cycle until achieving a film with the predetermined thickness.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Referring to FIG. 1, some embodiments of this disclosure relate to methods 100 of forming an electronic device. The methods comprise forming a graphene barrier layer 20 on a substrate surface 10 and depositing a fill layer 30 over the graphene barrier layer 20. In some embodiments, the graphene barrier layer 20 prevents diffusion of at least one element between the fill layer 30 and the substrate surface 10.

As used in this specification and the appended claims, the phrase "prevents diffusion" means that the graphene barrier layer eliminates or reduces the concentration of the at least one element in the destination material as compared to the concentration when no barrier layer is present. A "destination material" is the material into which the at least one element is diffusing. Diffusion may occur as a result of storage and/or use of the electronic device or may occur during subsequent processing steps.

In some embodiments, the substrate surface comprises a dielectric material. In some embodiments, the dielectric material is a low-k dielectric material. In some embodiments, the dielectric material is a high-k dielectric material. In some embodiments, the dielectric material comprises a metal oxide. In some embodiments, the dielectric material comprises or consists essentially of aluminum oxide (e.g., $Al_2O_3$).

As used in this specification and the appended claims, the term "consists essentially of", and the like, means that the subject film or composition is greater than or equal to about 95%, 98%, 99% or 99.5% of the stated active material. For gaseous compositions (e.g., reactive gases) the term "consists essentially of" refers to the active component of the composition, not including diluent, carrier or inert gases.

In some embodiments, the graphene barrier layer 20 is formed by a plasma-enhanced atomic layer deposition (PEALD) process. Without being bound by theory, it is believed that a PEALD process provides greater control over the thickness of the graphene barrier layer 20. The thickness of the graphene barrier layer 20 can be measured as a multiple of atomic layers or as an absolute thickness. In some embodiments, the graphene barrier layer 20 has a thickness in a range of about 2 to about 50 atomic layers or in a range of about 4 to about 30 atomic layers. In some embodiments, the graphene barrier layer 20 has a thickness of less than or equal to about 50 atomic layers, less than or equal to about 40 atomic layers, less than or equal to about 30 atomic layers, less than or equal to about 25 atomic layers, less than or equal to about 20 atomic layers, less than or equal to about 10 atomic layers, less than or equal to about 5 atomic layers, or less than or equal to about 3 atomic layers.

In some embodiments, the graphene barrier layer has a thickness in a range of about 5 Å to about 150 Å or in a range of about 15 Å to about 100 Å. In some embodiments, the graphene barrier layer has a thickness of less than or equal to about 150 Å, less than or equal to about 125 Å, less than or equal to about 100 Å, less than or equal to about 75 Å, less than or equal to about 50 Å, less than or equal to about 25 Å, or less than or equal to about 10 Å.

The fill layer 30 may be any suitable material. In some embodiments, the fill layer 30 comprises at least one element which is prevented from diffusing into the substrate surface 10 by the graphene barrier layer 20. In some embodiments, the fill layer 30 comprises or consists essentially of one or more metallic elements. In some embodiments, the fill layer 30 comprises or consists essentially of one or more of tungsten, ruthenium, copper, or cobalt.

In some embodiments, the at least one element is present in the fill layer 30 as a dopant. In some embodiments, the at least one element is present in the fill layer 30 as a byproduct of depositing the fill layer 30. In some embodiments, the at least one element comprises or consists essentially of one or more of a halogen, oxygen or boron. In some embodiments, the at least one element comprises or consists essentially of fluorine.

The fill layer 30 may be deposited by any suitable method. In some embodiments, the fill material 30 may be deposited by atomic layer deposition (ALD), chemical vapor deposition (CVD) or physical vapor deposition (PVD). In some embodiments, the fill layer 30 comprises a bulk metal material.

In some embodiments, the fill layer 30 comprises tungsten, and the fill layer 30 is deposited by a method comprising forming an amorphous silicon layer on the graphene barrier layer 20 and exposing the amorphous silicon layer to a tungsten precursor to form a tungsten layer by atomic substitution. In some embodiments, forming an amorphous silicon layer on the graphene barrier layer 20 comprises exposing the graphene barrier layer to a silane, polysilane or halogenated derivatives thereof. In some embodiments, the tungsten precursor comprises or consists essentially of tungsten and halogen atoms. In some embodiments, the tungsten precursor comprises or consists essentially of $WF_6$, $WCl_6$ and/or $WCl_5$. In some embodiments, the tungsten precursor comprises $WF_6$, and the at least one element comprises fluorine.

In some embodiments, the fill layer 30 comprises tungsten, and the fill layer 30 is deposited by a method comprising sequentially exposing the graphene barrier layer to a tungsten precursor and a reactant. As used in this regard, sequential exposure refers to the atomic layer deposition process described in general herein. In some embodiments, the tungsten precursor comprises or consists essentially of tungsten and halogen atoms. In some embodiments, the tungsten precursor comprises or consists essentially of $WF_6$, $WCl_6$ and/or $WCl_5$. In some embodiments, the reactant comprises or consists essentially of hydrogen gas ($H_2$) or silane ($SiH_4$).

While several embodiments of this disclosure have been described in relation to the graphene barrier layer preventing diffusion of the at least one element from the fill layer 30 to the substrate surface 10, it is also envisioned that the graphene barrier layer is useful to prevent diffusion of the at least one element from the substrate surface 10 to the fill layer 30.

Additional embodiments of this disclosure relate to an electronic device comprising a graphene barrier layer. In some embodiments, the electronic device comprises a graphene barrier layer between a first material and a second material. In some embodiments, the graphene barrier layer prevents diffusion of at least one element between the first material and the second material.

As identified herein, the graphene barrier layer may be formed by any suitable process. The graphene barrier layer may be restricted to any of the thicknesses disclosed herein. Specifically, in some embodiments, the graphene barrier layer has a thickness in a rage of about 15 Å to about 100 Å.

The at least one element can be any element as discussed elsewhere herein. In some embodiments, the at least one element comprises or consists essentially of one or more of a halogen, oxygen or boron. In some embodiments, the at least one element comprises or consists essentially of fluorine.

The first material and the second material may be any suitable materials. As diffusion is prevented between the first material and the second material, the designation of first and second is arbitrary. In some embodiments, the first material and the second material comprise the same material. In some embodiments, the first material the first material comprises or consists essentially of a metal and the second material comprises or consists essentially of a dielectric material. In some embodiments, the metal comprises or consists essentially of one or more of tungsten, ruthenium, copper, or cobalt. In some embodiments, the dielectric material comprises or consists essentially of a metal oxide. In some embodiments, the metal oxide is aluminum oxide (e.g., $Al_2O_3$).

In some embodiments, the electronic device comprising the graphene barrier layer is a 3D NAND device comprising a plurality of alternating layers of first material and second material. In some embodiments, the first material is a gate material and the second material is an oxide. In some embodiments, the first material is a nitride and the second material is an oxide.

Figure 2:
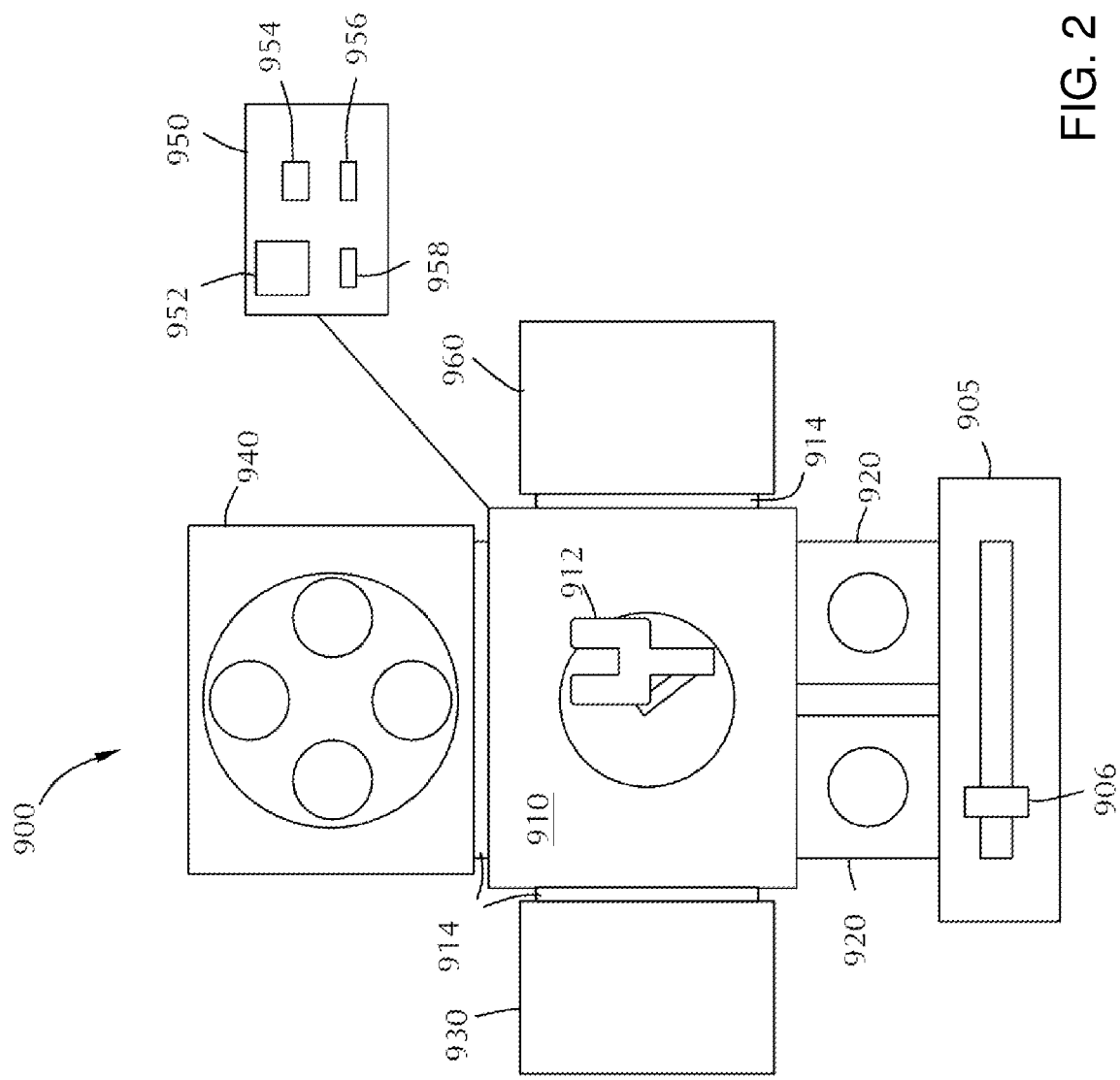
FIG. 2 illustrates a system that can be used to process a substrate according to one or more embodiments described herein.

With reference to FIG. 2, additional embodiments of the disclosure are directed to a system 900 for executing the methods described herein. FIG. 2 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 9, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as an anisotropic etching chamber and may be in fluid communication with one or more reactive gas sources to provide one or more flows of reactive gases to the first processing chamber 930. The substrate can be moved to and from the processing chamber 930 by the robot 912 passing through isolation valve 914.

Processing chamber 940 can also be connected to the central transfer station 910. In some embodiments, processing chamber 940 comprises an isotropic etching chamber and is fluid communication with one or more reactive gas sources to provide flows of reactive gas to the processing chamber 940 to perform the isotropic etch process. The substrate can be moved to and from the processing chamber 940 by robot 912 passing through isolation valve 914.

Processing chamber 945 can also be connected to the central transfer station 910. In some embodiments, the processing chamber 945 is the same type of processing chamber 940 configured to perform the same process as processing chamber 940. This arrangement might be useful where the process occurring in processing chamber 940 takes much longer than the process in processing chamber 930.

In some embodiments, processing chamber 960 is connected to the central transfer station 910 and is configured to act as a selective epitaxial growth chamber. The processing chamber 960 can be configured to perform one or more different epitaxial growth processes.

In some embodiments, the anisotropic etch process occurs in the same processing chamber as the isotropic etch process. In embodiments of this sort, the processing chamber 930 and processing chamber 960 can be configured to perform the etch processes on two substrates at the same time and processing chamber 940 and processing chamber 945 can be configured to perform the selective epitaxial growth processes.

In some embodiments, each of the processing chambers 930, 940, 945 and 960 are configured to perform different portions of the processing method. For example, processing chamber 930 may be configured to perform the anisotropic etch process, processing chamber 940 may be configured to perform the isotropic etch process, processing chamber 945 may be configured as a metrology station or to perform a first selective epitaxial growth process and processing chamber 960 may be configured to perform a second epitaxial growth process. The skilled artisan will recognize that the number and arrangement of individual processing chamber on the tool can be varied and that the embodiment illustrated in FIG. 9 is merely representative of one possible configuration.

In some embodiments, the system 900 includes one or more metrology stations. For example metrology stations can be located within pre-clean/buffer chamber 920, within the central transfer station 910 or within any of the individual processing chambers. The metrology station can be any position within the system 900 that allows the distance of the recess to be measured without exposing the substrate to an oxidizing environment.

At least one controller 950 is coupled to one or more of the central transfer station 910, the pre-clean/buffer chamber 920, processing chambers 930, 940, 945, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; a configuration to form a graphene barrier layer on the substrate surface; and a configuration to deposit a fill layer on the graphene barrier layer.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming an electronic device, the method comprising:

forming a graphene barrier layer on a substrate surface, the graphene barrier layer formed by a method comprising plasma enhanced atomic layer deposition; and depositing a fill layer over the graphene barrier layer, wherein the graphene barrier layer prevents diffusion of at least one element between the fill layer and the substrate surface.

2. The method of claim 1, wherein the substrate surface comprises a dielectric material.

3. The method of claim 2, wherein the dielectric material comprises a metal oxide.

4. The method of claim 2, wherein the dielectric material consists essentially of $Al_2O_3$.

5. The method of claim 1, wherein the graphene barrier layer has a thickness in a range of 15 Å to 100 Å.

6. The method of claim 1, wherein the fill layer comprises one or more of tungsten, ruthenium, copper, or cobalt.

7. The method of claim 1, wherein the at least one element comprises one or more of a halogen, oxygen or boron.

8. The method of claim 7, wherein the at least one element comprises fluorine.

9. The method of claim 1, wherein the fill layer comprises tungsten and the fill layer is deposited by a method comprising:

forming an amorphous silicon layer on the graphene barrier layer; and exposing the amorphous silicon layer to a tungsten precursor to form a tungsten layer by atomic substitution.

10. The method of claim 9, wherein the tungsten precursor comprises $WF_6$ and the at least one element comprises fluorine.

11. The method of claim 1, wherein the fill layer comprises tungsten and the fill layer is deposited by a method comprising sequentially exposing the graphene barrier layer to a tungsten precursor comprising $WF_6$ and a reactant.

12. A method of forming an electronic device, the method comprising:

forming a graphene barrier layer on a substrate surface comprising $Al_2O_3$;

forming an amorphous silicon layer on the graphene barrier layer; and exposing the amorphous silicon layer to a tungsten precursor to form a tungsten layer by atomic substitution, the tungsten precursor comprising $WF_6$, wherein the graphene barrier layer prevents diffusion of fluorine into the substrate surface.

13. An electronic device comprising a graphene barrier layer between a first material and a second material, wherein the graphene barrier layer prevents diffusion of at least one element between the first material and the second material, wherein the device is a 3D NAND device comprising a plurality of alternating layers of the first material and the second material.

14. The device of claim 13, wherein the graphene barrier layer has a thickness in a rage of 15 Å to 100 Å.

15. The device of claim 13, wherein the at least one element comprises one or more of a halogen, oxygen or boron.

16. The device of claim 15, wherein the at least one element comprises fluorine.

17. The device of claim 13, wherein the first material comprises tungsten and the second material comprises $Al_2O_3$.

18. The device of claim 17, the at least one element comprises fluorine.

* * * * *